(12) United States Patent
Van Kempen

(10) Patent No.: US 6,340,634 B1
(45) Date of Patent: Jan. 22, 2002

(54) METHOD OF MANUFACTURING AN ASSEMBLY OF CONDUCTORS AND A SEMICONDUCTOR DEVICE MANUFACTURED BY MEANS OF SUCH AN ASSEMBLY

(75) Inventor: Johannes M. A. M. Van Kempen, Nijmegen (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/510,160

(22) Filed: Feb. 22, 2000

(30) Foreign Application Priority Data

Feb. 23, 1999 (EP) .............................................. 99200504

(51) Int. Cl.$^7$ .............................................. H01L 21/44
(52) U.S. Cl. ........................ 438/666; 438/611; 438/111
(58) Field of Search ................................. 438/666, 611, 438/111, 669

(56) References Cited

U.S. PATENT DOCUMENTS

| 4,258,381 A | * | 3/1981 | Inaba |
| 5,497,681 A | * | 3/1996 | Ong |

FOREIGN PATENT DOCUMENTS

| EP | 0102988 B1 | 3/1984 |
| EP | 0887850 A2 | 12/1998 |
| JP | 61269347 A | 11/1986 |
| JP | 03152965 A | 6/1991 |
| JP | 07130938 A | 5/1995 |

\* cited by examiner

*Primary Examiner*—Caridad Everhart
(74) *Attorney, Agent, or Firm*—Steven R. Biren

(57) ABSTRACT

The invention relates to a method of manufacturing an assembly (100) of conductors (1), wherein a void (11) is provided in an electroconductive plate (10), within which void an island (12) is formed which serves as a carrier for a semiconductor element (13) and which is connected to the assembly (100) by a part (14) of the plate (10). Within the void (11), a number of strip-shaped conductors (1) are formed which surround the island (12), and the void (11) is formed so that one (1n) of the strip-shaped conductors (1) is connected to the island (12) by means of a further part (15) of the plate (10). Such a method has the drawback that it is not capable of providing an assembly (100) which can suitably be used for any semiconductor element (13). In particular, said method is expensive for ICs (13) which must demonstrate an electrical connection to the island (12) and which must be supplied in relatively small numbers. In a method in accordance with the invention, the void (11) is formed so that two or more strip-shaped conductors (1) are electroconductively connected to the island (12) by means of a further part (15) of the plate (10), and at least one of the further parts (15) of the plate (10) is removed by means of punching. Such a method is very suitable for ICs whose desired connection to the island (12) may be randomly situated. By removing the redundant connections (15) between the island (12) and the conductors (1) at a late stage in the manufacturing process and at the proper locations, said method in accordance with the invention is flexible, fast and inexpensive. This can be attributed to the fact that only the punching tool (40) used to remove the redundant connections (15) must be adapted to the relevant IC (13). This can be carried out rapidly and in a relatively cheap manner.

11 Claims, 4 Drawing Sheets

METHOD OF MANUFACTURING AN ASSEMBLY OF CONDUCTORS AND A SEMICONDUCTOR DEVICE MANUFACTURED BY MEANS OF SUCH AN ASSEMBLY

BACKGROUND OF THE INVENTION

The invention relates to a method of manufacturing an assembly of conductors, wherein a void is provided in an electroconductive plate, within which an island is formed which serves as a carrier for a semiconductor element, and which is connected to the assembly by a part of the plate, a number of strip-shaped conductors being formed within the void, which are situated around the island, and the void being formed such that one of the strip-shaped conductors is connected to the island by means of a further part of the plate. The invention also relates to a semiconductor device manufactured by means of such an assembly.

By virtue thereof, a connection region situated on the upper side of the semiconductor element can be readily connected to the lower side of the semiconductor element, namely by means of a wire connection between the upper side of the semiconductor element and the conductor. Such a connection is important for various semiconductor elements, such as in particular high-frequency ICs wherein the uppermost part, generally an epitaxial layer, is separated from the lowermost part, generally the substrate, by means of a high-impedance intermediate layer. In addition, or instead, such a conductor connected to the island may provide for an improved heat dissipation from the island, thus rendering the assembly extremely suitable for semiconductor elements which, in operation, dissipate relatively much heat.

Such a method is known from European patent specification 0.102.988, published on Sep. 21, 1988. In said document, FIG. 3 shows how an assembly of conductors is formed in a metal plate by means of a void wherein an island is formed which is surrounded by a number of conductors facing said island. The island is connected to the assembly by means of two parts of the plate. One of the conductors adjoining one of said parts is connected to said part of the plate by means of a further part of the plate. This conductor then demonstrates the above-mentioned advantages.

A drawback of the known method resides in that the assembly obtained by means of said method is relatively expensive. This drawback relates in particular to a number of ICs for consumer applications, such as ICs for use in mobile telephony and audio equipment. These ICs often are customized ICs, which are ordered for a relatively short period of time and thus are manufactured in relatively small numbers.

SUMMARY OF THE INVENTION

Therefore, it is an object of the invention to provide a method which enables an assembly of conductors to be obtained in a simple and inexpensive manner, in particular, when said assembly of conductors is to be used in said ICs for consumer applications.

To achieve this, a method in accordance with the invention is characterized in that the void is formed in such a manner that two or more strip-shaped conductors are electroconductively connected to the island by means of a further part of the plate, and at least one of the further parts of the plate is removed by means of punching. The invention is first of all based on the recognition that the known assembly can only suitably be used for a limited number of ICs because the desired position of the conductor connected to the island is not always the same. The invention is further based on the recognition that if an assembly is manufactured by means of photolithography and etching, which is most likely, then the assembly can be readily adapted but is still relatively expensive. The invention is finally based on the recognition that the use of the punching technique to manufacture the assembly is expensive, particularly, because each different IC requires the manufacture of a completely new punching tool. This is not only expensive but also time-consuming. By forming a conductor at various locations in the assembly, connecting said conductor to the island and, subsequently, removing the conductor at locations where it is not necessary by means of punching, important economies can be achieved: large numbers of semi-manufactured products of an assembly can be manufactured using one and the same punching tool. To obtain an assembly which can suitably be used for the intended semiconductor element, a number of connections between the island and the conductors are interrupted, namely those connections which are unnecessary or undesirable for the IC for which the assembly is intended. Said interruption can be readily carried out by means of punching using relatively simple punching tools. In accordance with the invention, only the latter punching tools have to be adapted to the intended application. As a result thereof, the method in accordance with the invention is both inexpensive and fast. That is to say, when the intended application changes, the production of an intended assembly can be started very rapidly.

In an important embodiment of a method in accordance with the invention, one or more of the conductors situated next to the part of the plate via which the island is connected to the assembly, are connected to the part of the plate by means of a first further part of the plate. In this manner, for each part of the plate to be connected to the island, two conductors can be connected to the island. In practice, the island often is connected to the assembly by means of two, or even four, parts of the plate. In these cases, maximally four or eight conductors can be connected to the island. If the number of (initially) chosen connections is N, and the number of removed connections is M, where M is smaller than or equal to N−1, then it applies that the removal of said M connections can take place in (N over M)-ways. That is to say, in N!/(M!*(N−M)!) ways. This variant is particularly suitable for making an electrical interconnection between the substrate and the island and hence for the above-mentioned very fast ICs for use, for example, in mobile telephony applications. An important advantage of this variant is that relatively little (mechanical) stress develops in the semiconductor device to be manufactured, so that this semiconductor device and, in particular, the electrical interconnection is very reliable.

In a preferred embodiment of a method in accordance with the invention, one or more of the conductors are directly connected to the island by means of a second, further part. This variant has the important advantage that also conductors which are not situated next to a part of the plate connecting the island to the assembly can be connected to the island. In this manner, in fact, all conductors can be connected to the island. This results in the freedom of manufacturing an assembly which can suitably be used for any IC. Also in this case, the minimum number of connections that is removed again by punching is 1. It is noted that this manner of making (temporary) connections between a conductor and the island can also be used for a conductor which does border on a part of the plate connecting the island to the assembly. This variant is particularly suitable for optimally cooling the island and hence for use in medium-power ICs, for example for the above-mentioned audio application.

Preferably, also for forming the void, use is made of the punching technique. The void does not necessarily have to be formed in a single (punching) step. In fact, it is preferred to form the void in a number of (punching) steps so as to enable a uniform removal and preclude the development of stresses in the assembly.

In a very important variant, the void is formed such that it demonstrates a prolongation into the island on either side of a conductor. By virtue thereof, the further parts to be removed again, particularly those further parts which form a direct connection between the island and a conductor, can very readily be removed by punching. A relevant aspect in this connection is that the further parts which have been removed again by punching are preferably removed by means of a C-shaped punch which contains a void at the location of a further part to be saved. As a result, only this punch has to be adapted to the intended IC to manufacture the suitable assembly. This can be carried out rapidly as well as inexpensively, so that this variant is very attractive.

After the assembly has been given a suitable structure for the intended IC, the relevant IC (semiconductor element) is mounted on the island and electroconductively connected to the different conductors, for example by means of wire connections, whereafter the IC (semiconductor element) thus provided with conductors is provided with a protective envelope and, finally, an individual semiconductor device is obtained by removing the semiconductor element provided with the envelope and the conductors from the assembly. As noted hereinabove, a medium-power and/or high-frequency IC is preferably chosen for the semiconductor element. The invention also relates to a semiconductor device obtained by means of a method in accordance with the invention.

These and other aspects of the invention will be apparent from and elucidated with reference to the embodiments described hereinafter.

Figure 1:
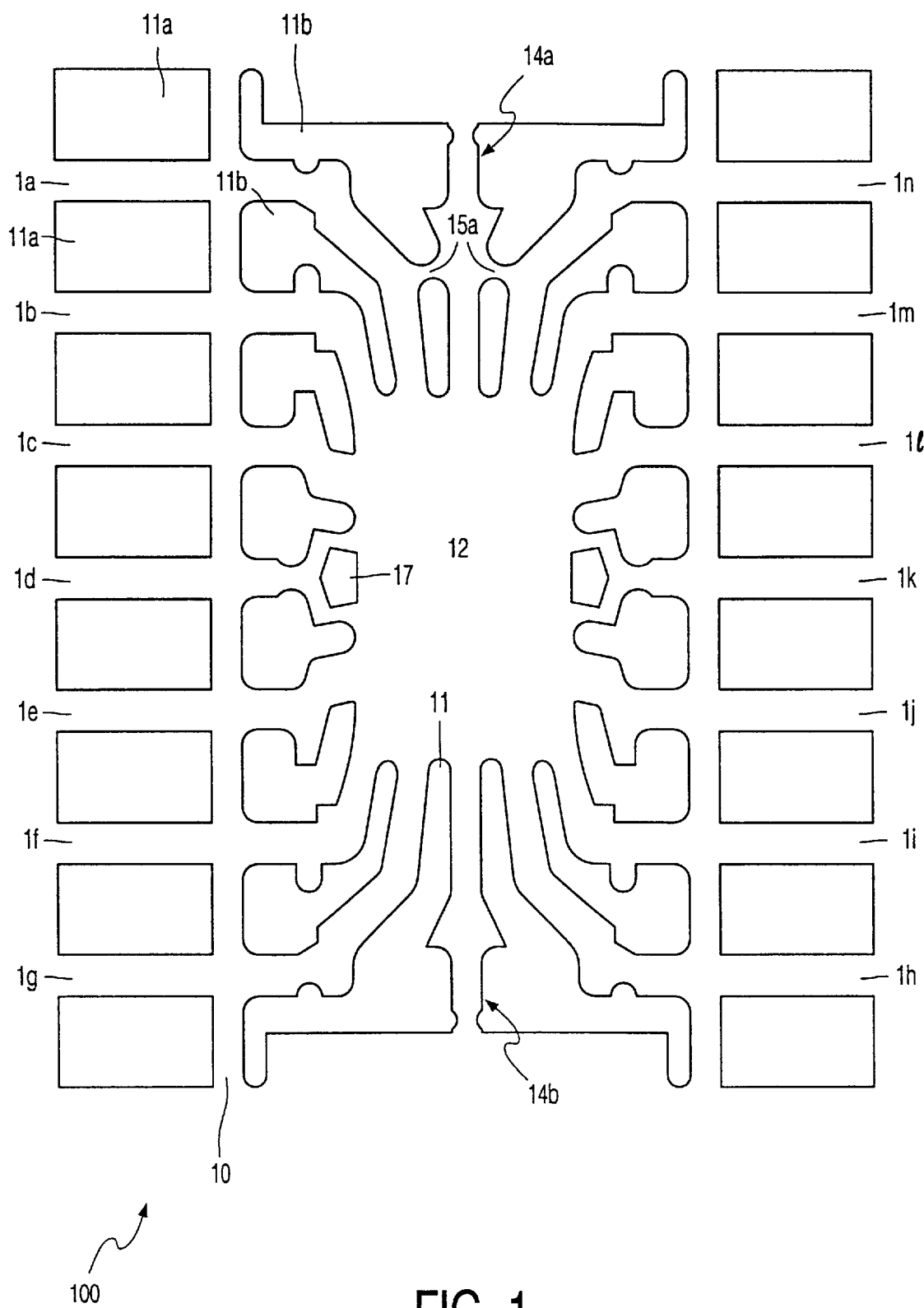
FIGS. 1 through 3 are diagrammatic, plan views of an assembly of conductors in successive manufacturing stages using a method in accordance with the invention.

The Figs. are diagrammatic and not drawn to scale. For example, in particular a possible periodicity in one or two mutually perpendicular directions is not shown. In practice, however, such a periodicity will be present. Corresponding regions are referred to by the same reference numeral whenever possible.

DESCRIPTION OF THE PREFERRED EMBODIMENTS

Figure 2:
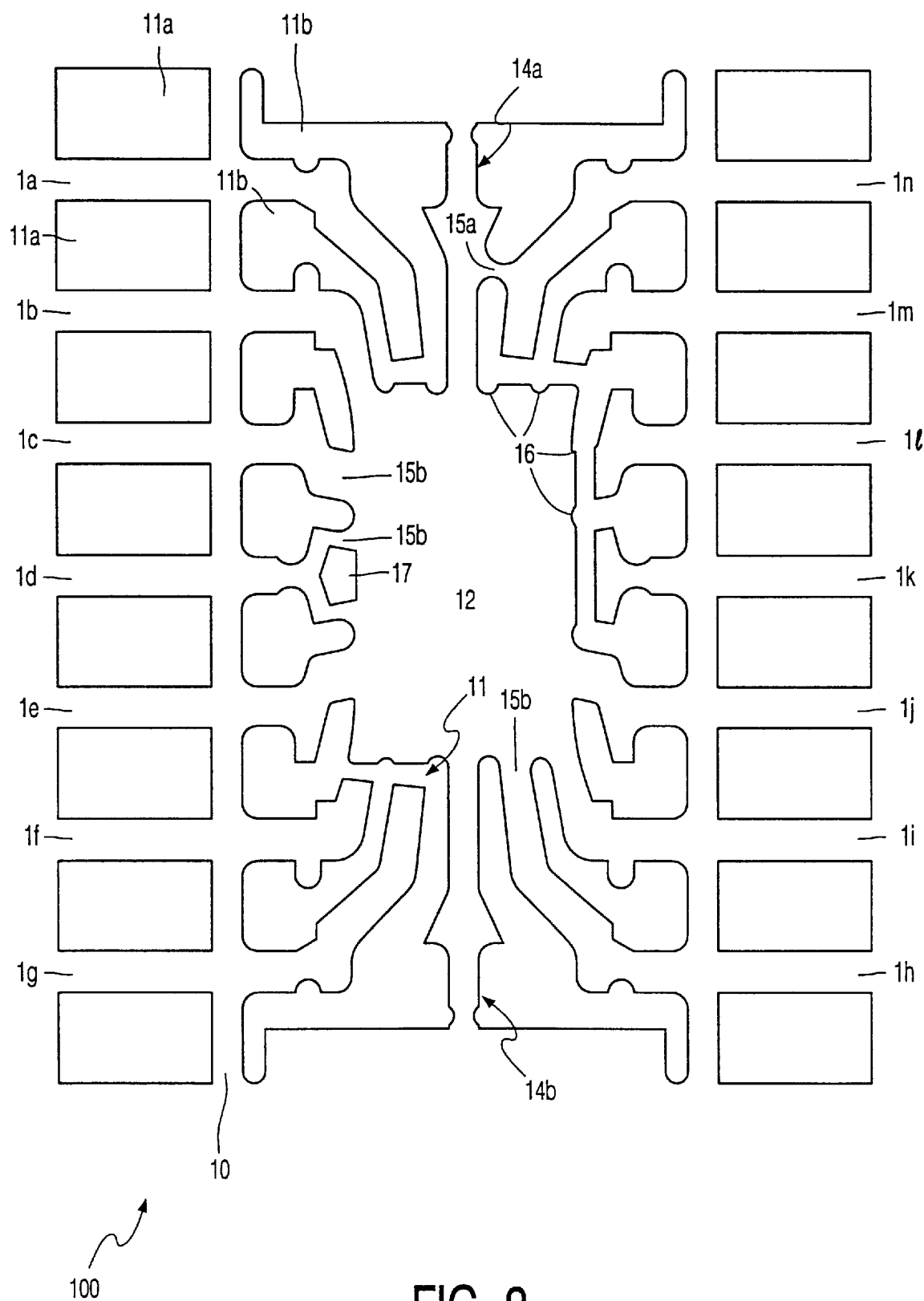
Figure 3:
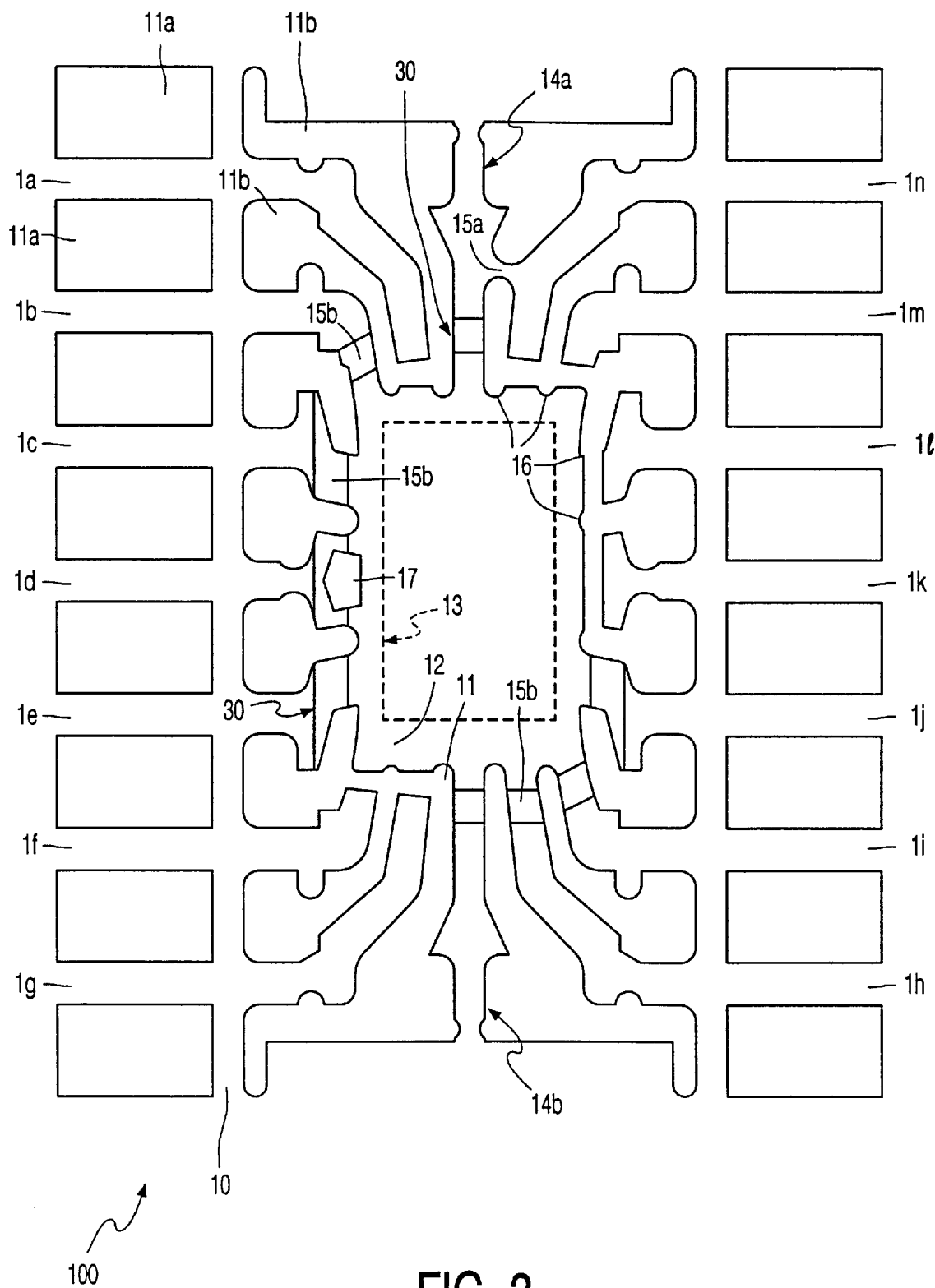

FIGS. 1 through 3 are diagrammatic, plan views of an assembly of conductors in successive manufacturing stages using a method in accordance with the invention. There is started from (see FIG. 1) a plate 10 of copper having a customary thickness of, for example, 0.2 mm. In said copper plate there is formed an island 12 which is situated within a void 11 and which serves as a carrier for a semiconductor element, such as an IC (=integrated circuit). At this stage, the void 11 comprises a large number of apertures 11 a first group 11a of which is situated on the outside of an assembly 100 of conductors 10 to be formed, and a second group of apertures 11b are situated around the island 12. Between two adjacent apertures 11a, 11b, conductors 1, in this case fourteen conductors 1a through 1n, of the assembly 100 are formed. In this example, the assembly 100 to be formed is of the DIL (=Dual In Line) type, and the island 11 to be formed is connected to the assembly 100 by means of a part 14, here two parts 14a, 14b. These parts 14a, 14b are not formed into conductors, but are used to (temporarily) secure the island 11 to the plate 10 and to support said island 11.

In accordance with the invention, and in this example, the void 11 is formed so that two or more of the conductors 1, here (inter alia) two conductors 1a, 1n which adjoin a part 14 of the plate 10, are connected to the island 11 to be formed by means of a further part 15a, 15b, here two first further parts 15a, of the plate 10. For this purpose, the apertures 11b adjoining the part 14a of the plate 10 are formed as two apertures between which the first further part 15a of the plate 10 is formed. In this example, the void 11 is formed by punching, and the tool used for this purpose is formed such that the two first further parts 15a of the plate 10 are saved. Eventually, as will become clear later on in the text, a conductor 1, in this example conductor 1m, will be permanently connected to the island 11 by only one of the first further parts 15a via the part 14 of the plate 10. This conductor 1m is eventually electroconductively connected, not shown in the drawing, to the upper side of the semiconductor element, for example by means of a wire connection.

In this example, according to the invention, also a number of conductors 1 to be formed of the assembly 100, here the conductors 1b through 1m, are directly connected to the island 12 to be formed by second further parts 15b of the plate 10. This too is taken into account in the design of the tools used to form the void 11. To match the electrical resistance of the (connection) conductor 1b as much as possible with that of the other conductors 1, the second further part 15b of the plate 10, belonging to the (connection) conductor 1b, is provided with a hole 17. Also the occurrence of stresses and/or deformations in the assembly 100 is precluded, or at least limited, by the hole 17. Eventually, as will become apparent later on in the text, only a part of the conductors 1b through 1m will be (permanently) connected to the island 11.

Subsequently, (see FIG. 2), in accordance with the invention at least one of the further parts 15a,15b of the plate 10 is removed again by means of punching. In this example, one of the two first further parts 15a is removed again, namely the first further part 15a connected on the left-hand side to the part 14a. In addition, in this example, a number of the second further parts 15b of the plate 10 are removed again by punching. In this example, these parts are the second further parts 15b of the plate 10, which connect the conductors 1a, 1f, 1g, 1h, 1m, 1n (directly) to the island 12. As a result, in the plate 10 an assembly 100 is formed which can very suitably be used for, in particular, so-called medium-power ICs, because a number of the conductors 1, here the conductors 1b, 1c, 1d, 1e, 1h, 1i, 1j, 1n, remain connected to the island 12 and provide for an optimum cooling of the island 12. The other conductors 1, here the conductors 1a, 1f, 1g, 1h, 1m, 1n, are electrically connected, for example by means of wire connections not shown in the Fig., to electrical terminals of the relevant IC.

In accordance with the invention, for again removing, by means of punching, the at least one further part 15a,15b of the plate 10, discussed hereinabove with reference to FIG. 2, use is preferably made of a punching die 40 shown in FIG.

Figure 4:
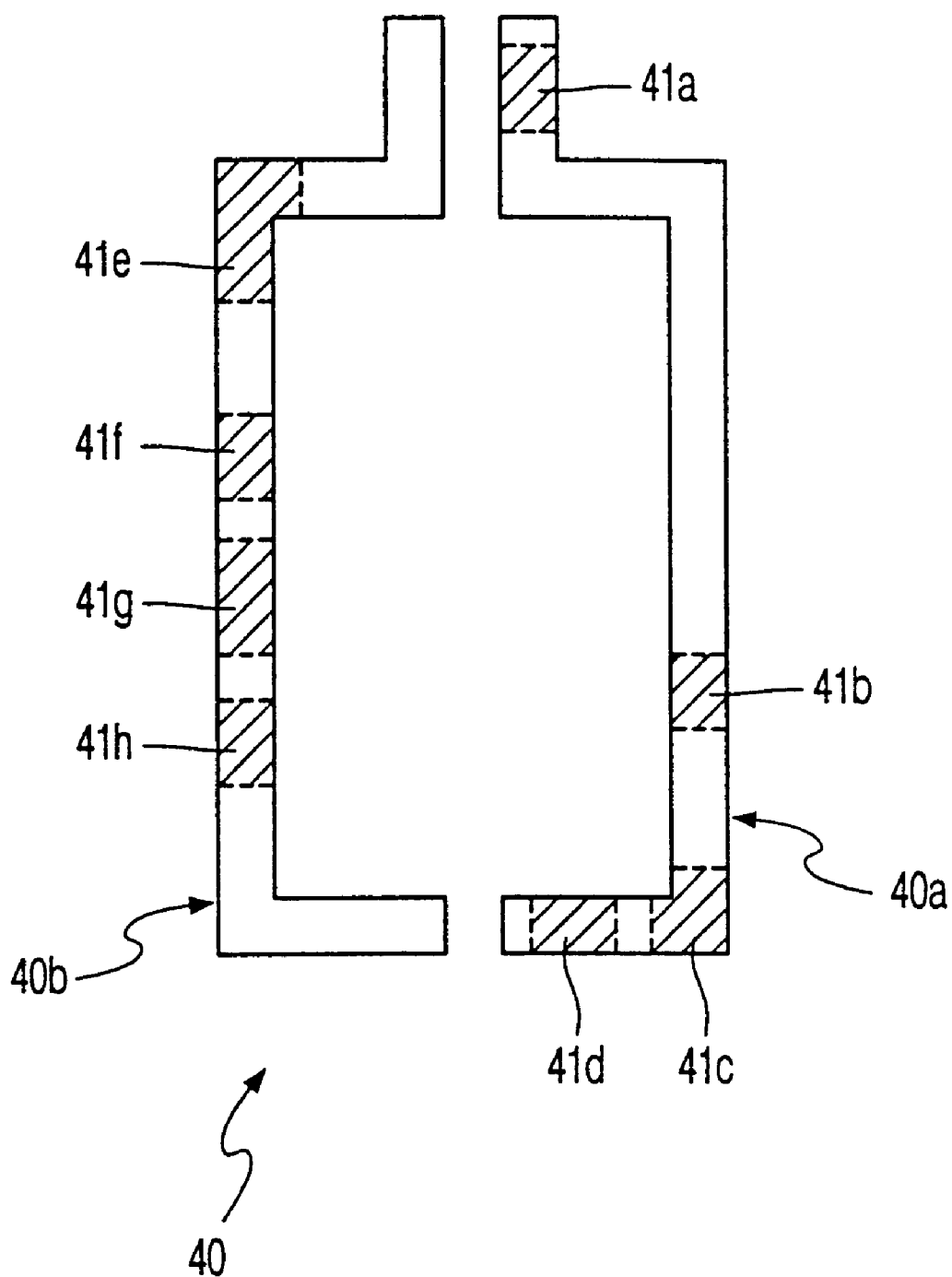
FIG. 4 is a diagrammatic, plan view of a punching die which is used in the method in accordance with the invention.

4. The die 40, as diagrammatically shown in plan view in FIG. 4, comprises, in this example, two C-shaped dies 40a, 40b which fit around the island 12. By means of this die 40, in principle all further parts 15a,15b can be removed from the plate 10 in a single punching operation. However, in accordance with the invention, the C-shaped die 40 is provided at the lower side with further voids 41 so that a number of first and second further parts 15a, 15b of the plate 10 are saved at the desired locations. In this example, these further parts 15 are the parts adjoining the conductors 1b, 1c, 1d, 1e, 1h,1i, 1j, 1k, 1m, for which purpose the die 40 is provided with further voids 41a, 41b, 41c, 41d, 41e, 41f, 41g, 41h, respectively. Preferably, the apertures 11b are formed so as to form an extension 16 into the island 12 with respect to the die 40. In this manner, the island 12 eventually comprises, after a number of second further parts 15b have been removed by means of the die 40, a number of characteristic voids 16 situated on either side of each second further part 15b that has been removed again.

The most important advantages of a method in accordance with the invention are obvious from the above description. By first connecting a large number of conductors 1 to the island 12 and subsequently removing a part of the connections 15a, 15b thus formed, the method in accordance with the invention is flexible, i.e. suitable for many different ICs. Only a limited part of the (punching) tools used in the manufacture, in particular the die 40 used to remove a further part 15a, 15b of the plate 10 by punching, must be adapted to each specific IC.

The invention is not limited to the example given hereinabove, as, within the scope of the invention, many modifications and variations are possible to those skilled in the art. In particular, it is noted again that the number of conductors which is connected, either directly or indirectly, to the island may be freely chosen but has to be greater than, or equal to, two. It is further noted that up to the stage where a part of the further parts are removed again, the assembly may alternatively be manufactured by means of photolithography and etching instead of punching.

With respect to the punching die used to again remove a part of the further parts, the following is noted. In the example given above, the die is only provided on the upper side with a projecting part which is used to again remove a part of the first further parts. If necessary, also the lower side of the die may be provided with such a projecting part. A die which is free of projecting parts and hence is a true ⊂ in shape, may also be advantageously used. In this case, the redundant, first further parts, if any, are removed again by means of a simple additional die which is intended for this purpose.

What is claimed is:

1. A method of manufacturing an assembly of conductors, wherein a void is provided in an electroconductive plate, within which an island is formed which serves as a carrier for a semiconductor element, and which is connected to the assembly by a part of the plate, a number of strip-shaped conductors being formed within the void, which are situated around the island, and the void being formed such that one of the strip-shaped conductors is connected to the island by means of a further part of the plate, characterized in that the void is formed in such a manner that two or more strip-shaped conductors are electroconductively connected to the island by means of a further part of the plate, and at least one of the further parts of the plate is selectively removed by means of punching.

2. A method as claimed in claim 1, characterized in that one or more of the conductors situated next to the part of the plate via which the island is connected to the assembly, are connected to the part of the plate by means of a first further part of the plate.

3. A method as claimed in claim 1, characterized in that one or more of the conductors are directly connected to the island by means of a second, further part.

4. A method as claimed in claim 3, characterized in that the second, further part is provided with an aperture.

5. A method as claimed in claim 1, characterized in that the void is formed by punching.

6. A method as claimed in claim 5, characterized in that the void is formed so that it demonstrates a prolongation into the island on either side of a conductor and in the extension thereof.

7. A method as claimed in claim 4, characterized in that the further parts which have been removed again by punching, are removed by means of a C-shaped die which comprises a further void at the location of a further part to be saved.

8. A method as claimed in claim 1, characterized in that a semiconductor element is mounted on the island and electroconductively connected to the conductors, the semiconductor element and a part of the conductors are provided with a protective envelope, and a separate semiconductor device is obtained by removing the semiconductor element provided with the envelope and the conductors from the assembly.

9. A method as claimed in claim 1, characterized in that a high-frequency and/or medium-power IC is chosen for the semiconductor element.

10. A punching die which can suitably be used in a method as claimed in claim 1, characterized in that the punching die is C or ⊂-shaped and provided with a number of voids.

11. A semiconductor device obtained by means of a method as claimed in claim 7.

* * * * *